(12) United States Patent
Shirvani-Mahdavi et al.

(10) Patent No.: US 8,340,619 B1
(45) Date of Patent: Dec. 25, 2012

(54) PHASE SYNCHRONIZATION OF PHASED ARRAY OR MULTIPLE RECEIVER/TRANSMITTER SYSTEMS

(75) Inventors: Alireza Shirvani-Mahdavi, San Jose, CA (US); Saeed Chehrazi, Mountain View, CA (US)

(73) Assignee: Marvell International Ltd. (BM)

( * ) Notice: Subject to any disclaimer, the term of this patent is extended or adjusted under 35 U.S.C. 154(b) by 508 days.

(21) Appl. No.: 12/695,352

(22) Filed: Jan. 28, 2010

Related U.S. Application Data

(60) Provisional application No. 61/152,412, filed on Feb. 13, 2009.

(51) Int. Cl.
 *H04B 1/26* (2006.01)
(52) U.S. Cl. .......... 455/318; 455/319; 455/75; 455/302; 455/323; 370/396; 343/853; 342/368; 342/369; 332/105; 332/103; 327/359; 398/208; 398/152; 398/202
(58) Field of Classification Search ........... 455/302, 455/318, 323; 370/396; 343/853; 342/368; 342/369; 332/105, 103; 327/359; 398/208, 398/152, 202
See application file for complete search history.

(56) References Cited

U.S. PATENT DOCUMENTS

| | | | |
|---|---|---|---|
| 7,130,604 B1 * | 10/2006 | Wong et al. | 455/302 |
| 7,750,749 B2 * | 7/2010 | Jones | 332/105 |
| 8,078,065 B2 * | 12/2011 | Koc | 398/208 |
| 2007/0116015 A1 * | 5/2007 | Jones | 370/396 |
| 2007/0159407 A1 * | 7/2007 | Bolle et al. | 343/853 |

OTHER PUBLICATIONS

Ali Hajimiri et al, "Integrated Phased Array Systems in Silicon", Proceddings of the IEEE, Sep. 2005, vol. 93, No. 9.
Hossein Hashemi et al, "A 24-GHz SiGe Phased-Array Receiver-LO Phase-Shifting Approach", IEEE Transactions on Microwave Theory and Techniques, Feb. 2005, vol. 53, No. 2.

\* cited by examiner

*Primary Examiner* — April G Gonzales

(57) ABSTRACT

In one embodiment, a local oscillator (LO) is configured to generate an LO signal. A transmission line receives the LO signal from the local oscillator and transmits the LO signal. A first set of taps and a second set of taps tap the transmission line to receive the LO signal. A plurality of transceiver blocks are configured to receive and transmit a plurality of phase-shifted radio frequency signals. Each transceiver block is coupled to a first tap and a second tap. Each LO signal received for a transceiver block is received with a different phase. However, the same reference phase may be calculated from a first LO signal received from the first tap and a second LO signal received from a second tap. Each transceiver block receives the reference LO signal having the reference phase determined from the first LO signal and the second LO signal.

20 Claims, 8 Drawing Sheets

PHASE SYNCHRONIZATION OF PHASED ARRAY OR MULTIPLE RECEIVER/TRANSMITTER SYSTEMS

CROSS REFERENCE TO RELATED APPLICATIONS

The present disclosure claims priority to U.S. Provisional App. No. 61/152,412 for "Method and Means for Phase Synchronization of Multiple Receiver, Transmitter or Phased Array Systems" filed Feb. 13, 2009, the contents of which is incorporated herein by reference in their entirety.

BACKGROUND

Particular embodiments generally relate to wireless communication and more specifically to phase synchronization in a phased-array or multiple receiver/transmitter systems.

Unless otherwise indicated herein, the approaches described in this section are not prior art to the claims in this application and are not admitted to be prior art by inclusion in this section.

A phased-array transceiver includes multiple antennas that are spatially separated. Due to the distance between antennas, delayed versions of a radio frequency signal are received or transmitted by each antenna. The background will describe a receiver scenario but similar concepts apply to a transmitter. One method of constructing a desired signal from received signals is to adjust the delay of the received signals. However, to add variable delay to each signal received by different antennas requires an analog delay line, where the analog delay line requires a large chip area. Additionally, changing the delay for each received signal is difficult.

Another method of constructing a desired signal is to down convert received signals using accurate phase-shifted versions of a local oscillator (LO) signal. Each received signal may require a different phase of the local oscillator signal. Various conventional techniques for generating different phases of a local oscillator signal are described below.

FIG. 1A depicts a system 100 for generating different phases of a local oscillator signal in accordance with a first conventional technique. System 100 includes a local oscillator (LO) 102, a phase generator 104, and transceiver blocks 106a-106c. Local oscillator 102 is configured to generate a local oscillator signal, such as a high frequency local oscillator signal. Phase generator 104 receives the local oscillator signal, generates all the required phases of the local oscillator signal, and distributes the LO signals with different phases to each transceiver block 106.

Four local oscillator signals with four different phases are generated. Each local oscillator signal is transmitted to each transceiver block 106 through a distribution line. However, having a distribution line for sending each phase to each transceiver block 106 requires a lot of area. Also, each distribution line generally needs to be of an equal length to provide the LO signal to transceiver blocks 106 with accurate phases. For example, a LO signal with a first phase is sent to all three transceiver blocks 106a-106c. If a distribution line to transceiver block 106c is longer than a distribution line to transceiver block 106a, then the LO signal received at transceiver block 106c will have a different phase from the LO signal received at transceiver block 106a. Thus, an accurate phase shifted LO signal has not been provided to each transceiver block 106. An additional problem with using distribution lines is that coupling between the distribution lines may alter the phases of the LO signals.

FIG. 1B depicts a system 150 for generating different phases of a local oscillator signal in accordance with a second conventional technique. System 150 includes a local oscillator (LO) 1-102, phase generators 1-104a-1-104d, and transceiver blocks 1-106a-1-106d. LO 1-102 generates an LO signal. This LO signal is distributed to all transceiver blocks 1-106a-1-106d. Phase generators 1-104a-104b each generate the required phases of the LO signal for transceiver blocks 106a-106d. To accurately generate the different phases precisely, each phase generator 1-104 requires the same phase of the LO signal as a reference. Equal length distribution lines are used to make sure the reference LO signal is received at each phase generator 1-104 with the same phase. For example, system 150 uses a symmetric tree network that distributes the LO signal. As with the distribution lines shown in FIG. 1A, the symmetric tree network shown in FIG. 1B requires a significant amount of chip area.

FIG. 2 depicts a system 200 that uses taps on a transmission line 202 in order to generate different phases of a local oscillator signal. Local oscillator 1-102 generates an LO signal, where the LO signal is passed through transmission line 202. The LO signal is distributed to each transceiver block 1-106a-106d though taps 204a-204d on transmission line 202. Using this structure may save chip area; however, an undesirable phase shift results over the length of transmission line 202.

As shown in FIG. 2, there is a phase shift of $\Delta\Phi$ in between each tap. Reference LO signals $LO_1$-$LO_4$ will thus have different phases. Having a reference signal with different phases is not desirable because each transceiver block 1-106 needs to have an accurate, known phase of the reference LO signal to process the radio frequency signals. However, the phase shift needs to measured and compensated for or the phase shift needs to be synchronized. However, it is difficult to measure the phase shift or synchronize the phase shift of reference signals when using a transmission line.

SUMMARY

In one embodiment, a phase synchronizer for a transceiver is provided. A local oscillator (LO) is configured to generate an LO signal. A transmission line receives the LO signal from the local oscillator and transmits the LO signal. A first set of taps and a second set of taps are coupled to the transmission line and tap the transmission line to receive the LO signal.

A plurality of transceiver blocks are configured to receive and transmit a plurality of phase-shifted radio frequency signals. Each transceiver block is coupled to a first tap and a second tap. Each LO signal received for a transceiver block is received with a different phase. However, the same reference phase may be calculated from a first LO signal received from the first tap and a second LO signal received from a second tap. For example, the first LO signal received from the first tap is combined with the second LO signal received from the second tap to determine a reference LO signal having the reference phase. Each transceiver block receives the reference LO signal having the reference phase determined from the first LO signal and the second LO signal.

In one embodiment, a transceiver is provided comprising: a local oscillator (LO) configured to generate an LO signal; a transmission line configured to receive the LO signal from the local oscillator and transmit the LO signal; a set of first taps coupled to the transmission line to tap the transmitted LO signal from the transmission line; and a set of second taps coupled to the transmission line to tap the transmitted LO signal from the transmission line; and a plurality of transceiver blocks configured to receive and transmit a plurality of phase shifted radio frequency signals, wherein for each transceiver block in the plurality of transceiver blocks, a first LO signal at a first phase shift is received from a first tap in the set of taps and a second LO signal at a second phase shift is received from a second tap in the set of taps, wherein for each transceiver block in the plurality of transceiver blocks, the received first LO signal at the first phase shift and the received second LO signal at the second phase shift are combined to determine a reference LO signal having a third phase shift, and wherein each reference LO signal determined for each transceiver block has the third phase shift.

In another embodiment, a method is provided comprising: providing a plurality of transceiver blocks for receiving and transmitting a plurality of phase shifted radio frequency signals; for each transceiver block, performing: receiving a first LO signal at a first phase shift from a first tap in a transmission line; receiving a second LO signal at a second phase shift from a second tap in the transmission line; and combining the received first LO signal at the first phase shift and the received second LO signal at the second phase shift to determine a reference LO signal having a third phase shift, wherein the third phase shift is a same phase shift as a reference LO signal determined by other transceiver blocks in the plurality of transceiver blocks.

In another embodiment, a wireless communication system included the apparatus is provided.

The details of one or more implementations are set forth in the accompanying drawings and the description below. Other features and advantages will be apparent from the description and drawings, and from the claims.

DETAILED DESCRIPTION

Described herein are techniques for a phased array or multiple receiver/transmitter system. In the following description, for purposes of explanation, numerous examples and specific details are set forth in order to provide a thorough understanding of the present invention. The present invention as defined by the claims may include some or all of the features in these examples alone or in combination with other features described below, and may further include modifications and equivalents of the features and concepts described herein.

Particular embodiments provide a phase synchronizer for a phased-array transceiver or multiple receiver/transmitter systems. In one implementation, a transmission line is formed in a U shape and each transceiver block includes two taps on the transmission line, one tap on each arm of the U shaped transmission line. Therefore, two local oscillator (LO) signals with different phases are received at each transceiver block. However, the two LO signals for each transceiver block are combined to form a reference LO signal that has the same phase for each transceiver block.

Figure 3:
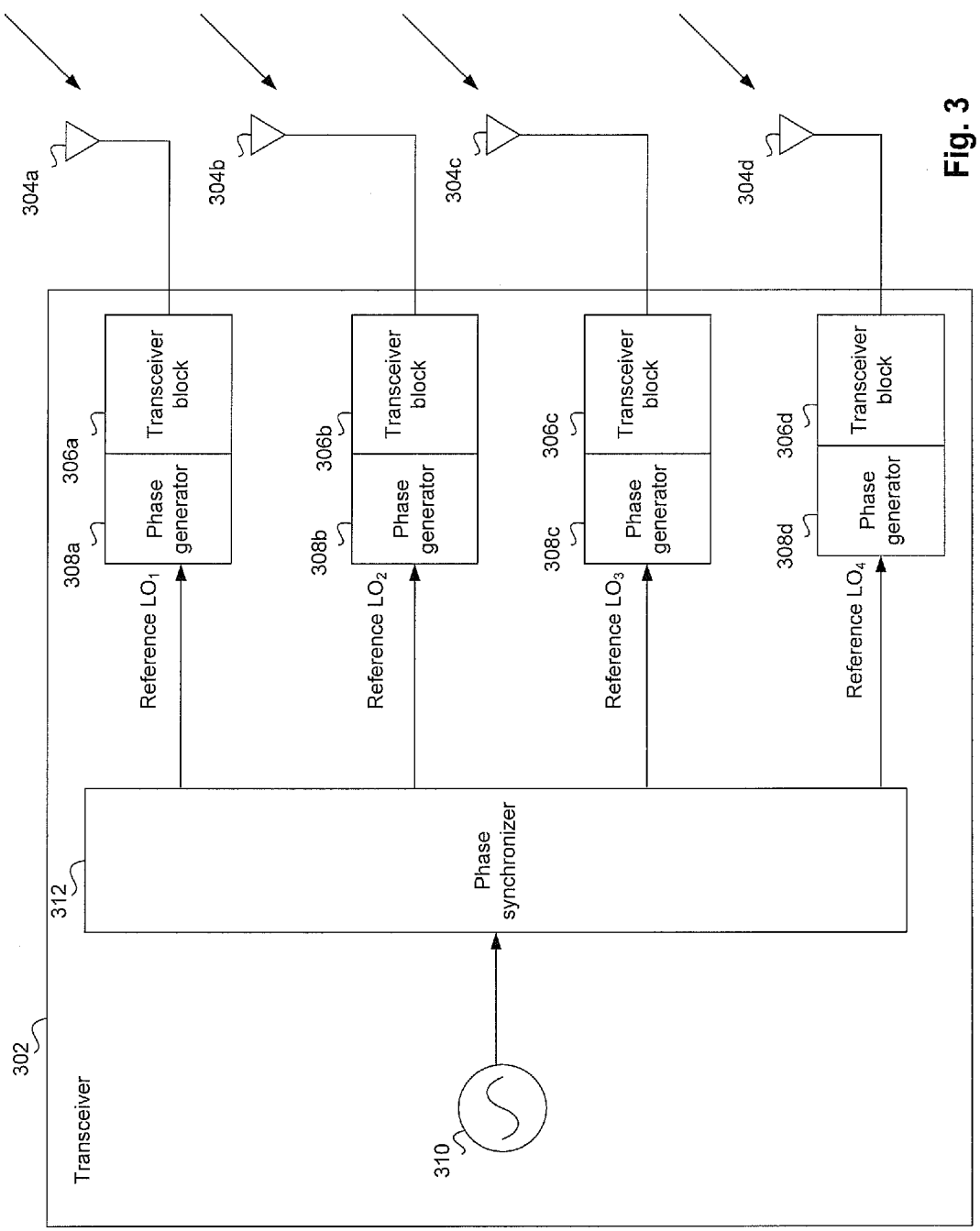
FIG. 3 depicts an example of transceiver according to one embodiment.

FIG. 3 depicts an example of a transceiver 302 according to one embodiment. Transceiver 302 may be part of a wireless communication device. In one embodiment, transceiver 302 processes signals at an extremely high frequency (EHF) radio frequency band. EHF may include the range of frequencies from 30 to 300 GHz. In one example, transceiver 302 is operating at around 60 GHz. Although these frequencies are described, it will be understood that particular embodiments may process signals at other frequencies.

Transceiver 302 may be a phased array system or multiple input multiple output (MIMO) system. A phased array system is a group of antennas 304a-340d where the relative phases of respective signals being received or transmitted by antennas 304a-304d are varied.

A MIMO system is the use of multiple antennas at transceivers. The phase varies for signals received in the MIMO system also. Although phased array and MIMO systems are described, it will be understood that particular embodiments may be used in any system in which different phases of a signal result and need to be compensated for using a local oscillator signal. The term phased array may be used herein for discussion purposes.

The following description will be described with respect to received signals. However, it will be understood that the concepts described also apply to transmitted signals. A person of skill in the art will appreciate how transmission of signals may use particular embodiments in accordance with the teachings of the present disclosure.

Radio frequency (RF) signals are received at antennas 304. Antennas 304 may be arranged in different spatial configurations. For example, antennas 304 are equally spaced apart. Because of the spacing of antennas 304, radio frequency signals are received with different delays in the arrival of the signals. A difference in time of arrival depends upon the angle of the signals and spacing between the antennas. The time-delay difference between signals received from different antennas 304 is compensated for and the RF signals are combined coherently to determine a desired signal from a desired direction while rejecting signals from other directions. The signals may be added coherently in the desired spatial direction (constructive) and incoherently (destructive) in all other directions in space.

Particular embodiments are directed to down converting each received RF signal using different phase-shifted versions of a local oscillator (LO) signal. The phase of a received RF signal can be adjusted by using different phases of the LO signal used in the down conversion of the received RF signal to a lower frequency. The down conversion is a multiplication of the LO signal and the received RF signal using a mixer (not shown). The output of the multiplication is a linear combination of the phases of the received RF signal and the LO signal. Each transceiver block 306 may receive an RF signal at a different delay or phase. LO signals with different phases are used to down convert the RF signal to a signal with a same phase as other down converted signals from other transceiver blocks 306. Thus, after down conversion, all the down converted signals output by the mixer have the same phase.

A local oscillator 310 is configured to provide a local oscillator (LO) signal to phase synchronizer 312. Phase synchronizer 312 provides the reference LO signal with the same reference phase to phase generators 308 of each transceiver block 306. Each phase generator 308 uses the reference LO signal to generate the appropriate LO signal with a different phase. The LO signals with different phases are then used to down convert the radio frequency signals received from antenna 304. A person of skill in the art will appreciate how the down conversion is performed based on the disclosure and teachings herein.

Particular embodiments are directed to providing a synchronized reference LO signal to allow phase generators 308 to generate the required phases for the down conversion. For example, N number of phases may be generated and depending on the delay of the RF signal different phases may be used in the down conversion.

To accurately generate all the phases, the reference LO signal is provided to each transceiver block 306 with a phase that is synchronized (i.e., substantially the same). Particular embodiments use a phase synchronizer 312 that is configured to accurately provide the reference LO signal with substantially the same phase into phase generator 308 of each transceiver block 306. In one embodiment, phase synchronizer 312 uses a U shaped transmission line with multiple taps to synchronize the phase of the reference LO signal.

Figure 4:
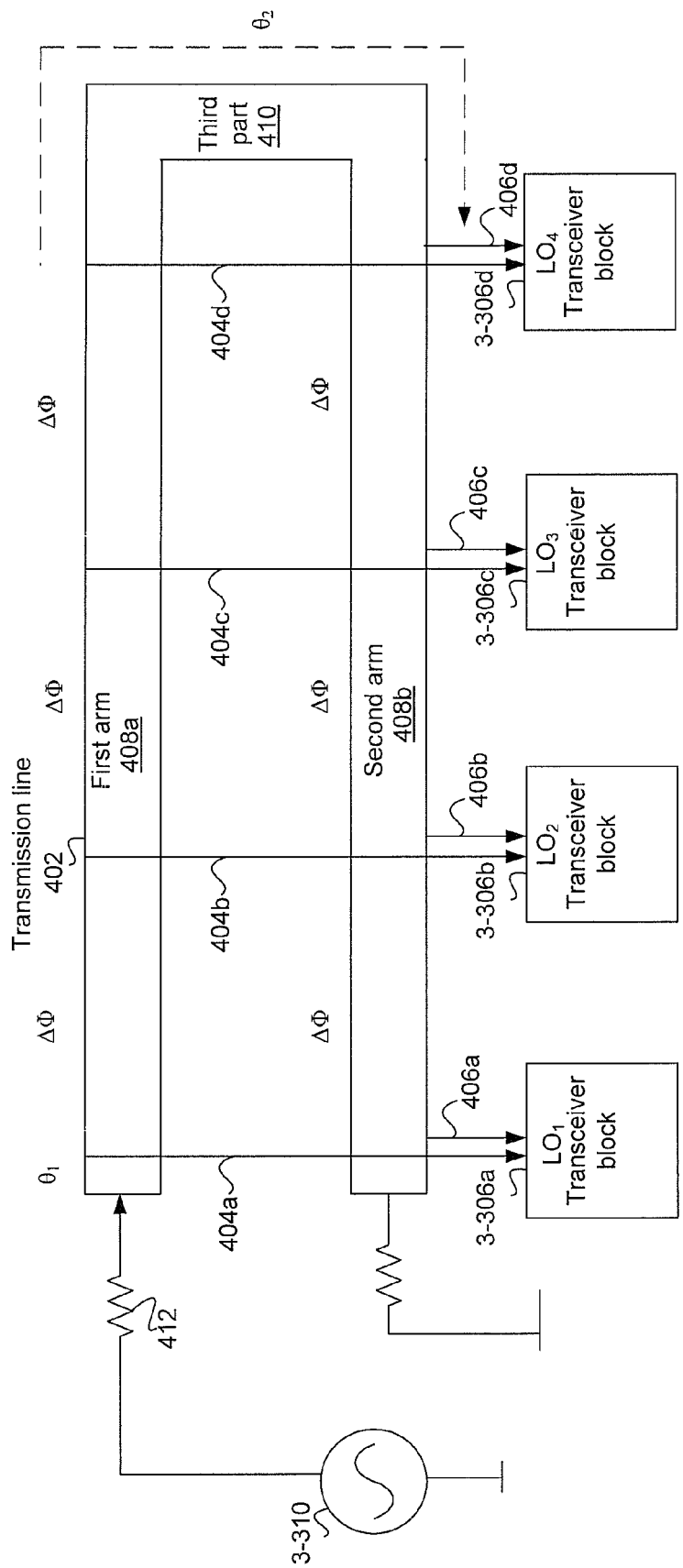
FIG. 4 depicts an example of a phase synchronizer according to one embodiment.

FIG. 4 depicts a more detailed example of phase synchronizer 3-312 according to one embodiment. Phase synchronizer 3-312 includes a transmission line 402, a plurality of first taps 404a-404d, and a plurality of second taps 406a-406d. Although two set of taps are described, it will be understood that more than two taps may be used.

Local oscillator 3-310 is configured to output the local oscillator signal through a resistor 412 to transmission line 402. The LO signal may be A Sin($\omega$t), where A is the amplitude and $\omega$ is the frequency.

In one embodiment, transmission line 402 is a bent transmission line. A bent transmission line includes a first arm 408a, a second arm 408b, and a third part 410. As shown, transmission line 402 is in a U shape with first arm 408a being parallel with second arm 408b. Third part 410 connects first arm 408a with second arm 408b. Although a U shape is described it will be understood that other shapes may be used. For example, other shapes (e.g., a V shape, a W shape, and so on) that provide LO signals that combine to form a reference LO signal as described below may be used.

In one embodiment, each transceiver block 3-306 is placed an equal distance from a neighboring block 3-306. Also, each transceiver block 3-306 includes a first tap 404 and a second tap 406. First taps 404a-404d are coupled to first arm 408a and second taps 406a-406d are coupled to second arm 408b. Although four transceiver blocks 3-306 are shown, it will be understood that any number of transceiver blocks 3-306 may be used. The number of first taps 404 and second taps 406 also varies with the number of transceiver blocks 3-306 used.

As the LO signal travels down transmission line 402, different phase shifts of the LO signal result. If first taps 404 are evenly spaced on first arm 408A and second taps 406 are evenly spaced on second arm 408B at the same positions, the same phase shift ($\Delta\Phi$) results between each tap on transmission line 402. As shown in FIG. 4, the same $\Delta\Phi$ phase shift occurs between first tap 404a and first tap 404b, first tap 404b and first tap 404c, and so on. Also, on second arm 408b, the same $\Delta\Phi$ phase shift occurs between second tap 406a and second tap 404b, between second tap 404b and second tap 404c, and so on.

First taps 404 and second taps 406 tap transmission line 402 at a same relative position from a reference point. For example, if a straight line is drawn across first arm 408a and second arm 408b, a first tap 404 is positioned at the intersection of the line and first arm 408a and a second tap 406 is positioned at an intersection of the line and second arm 408b. Thus, first tap 404 and second tap 406 tap transmission line at the same respective positions on first arm 408a and second arm 408b. In this case, first arm 408a and second arm 408b are parallel and first taps 404a are positioned at a tap point that is the same as a tap point on second arm 408b as measured from third part 410. Although FIG. 4 may show first taps 404 and second taps 406 as being slightly off, it will be understood that first taps 404 and second taps 406 are substantially in the same position.

An additional phase shift occurs on transmission line 402 before tap 404a ($\theta_1$) and in between taps 404d and 406d ($\theta_2$). These phase shifts are also used in determining the reference LO signal as will be described in more detail below.

Particular embodiments provide a synchronized reference LO signal of the same phase to all transceiver blocks 3-306 by combining the two phase-shifted LO signals received from first tap 404 and second tap 406. Each transceiver block 3-306 receives a reference LO signal with the same phase even though each LO signal received from first taps 404 and second taps 406 for each transceiver 3-306 has a different phase.

The reference LO signal that is received at each transceiver block may be an addition of a first LO signal received from tap 404 and a second LO signal received from tap 406. As will be described in more detail below, an adder (not shown) may be used to add the first LO signal and the second LO signal. For each transceiver block 3-306, the first LO signal received from tap 404 and a second LO signal received from tap 406 have different phase shifts. When the first LO signal received from tap 404 and a second LO signal received from tap 406 are added together, the phase shift is the average of the two LO signals. When this addition is performed for every transceiver block 3-306, the phase shift after the addition is the same for all reference signals received by transceiver blocks 3-306. Thus, a synchronized reference signal with the same reference phase is provided to all transceiver blocks 3-306.

In an example, a LO signal received from tap 404a may include the phase shift of $\theta_1$. $\theta_1$ may be the phase shift that occurs from transmitting the LO signal A Sin($\omega$t) along transmission line 402 to tap 404a. Also, the LO signal received from second tap 406a has the phase shift of $\theta_1+6\Delta\Phi+\theta_2$. The 6$\Delta\Phi$ results from the 3 $\Delta\Phi$ phase shifts that occur on first arm 408 and the 3 $\Delta\Phi$ phase shifts that occur on second arm 408. $\theta_2$ is the phase shift that occurs between taps 404d and 406d. As can be seen, the phase shift differs depending on where the LO signal is tapped. As the signal travels through transmission line 402, the phase shift changes result.

The following equations represent the LO signals received at transceiver blocks 3-306. The variable "n" in the equations represent the number of transceiver blocks 3-306.

Reference $LO_1 = A \operatorname{Sin}(\omega t+\theta_1) + A \operatorname{Sin}(\omega t+\theta_1+\theta_2+2(n-1)\Delta\Phi)$ Reference $LO_2 = A \operatorname{Sin}(\omega t+\theta_1+\Delta\Phi) + A \operatorname{Sin}(\omega t+\theta_1+\theta_2+[2(n-1)-1]\Delta\Phi)$ Reference $LO_3 = A \operatorname{Sin}(\omega t+\theta_1+2\Delta\Phi) + A \operatorname{Sin}(\omega t+\theta_1+\theta_2+[2(n-1)-2]\Delta\Phi)$ Reference $LO_n = A \operatorname{Sin}(\omega t+\theta_1+(n-1)\Delta\Phi) + A \operatorname{Sin}(\omega t+\theta_1+\theta_2+[2(n-1)-(n-1)]\Delta\Phi)$ Reference $LO_n$ is the reference signal after an addition of the two LO signals received from tap 404 and tap 406. For example, for reference signal $LO_1$, A Sin($\Omega$t+$\theta_1$) represents the LO signal received from tap 404a and A Sin($\Omega$t+$\theta_1$+$\theta_2$+2(n-1)$\Delta\Phi$) represents the LO signal received from tap 406a. As can be seen above, the LO signals all have different phases.

For example, LO signals for transceiver block 3-306a have different phases than LO signals for all the other transceiver blocks 3-306b-3-306d.

Even though LO signals have different phases for transceivers 3-306a-3-306d, after a mathematical calculation (e.g., an addition), each reference LO signal generated in transceivers 3-306a-3-306d has the same phase (referred to as the reference phase). However, the reference LO signals have different amplitudes, but the amplitudes may be adjusted as will be discussed below. The following equations depict the result of the mathematical calculation, where "n" is the number of transceiver blocks 3-306:

$$LO_1 = 2A\text{Sin}\left(wt + \theta_1 + \frac{\theta_2 + 2(n-1)\Delta\Phi}{2}\right)\text{Cos}\frac{(\theta_2 + 2(n-1)\Delta\Phi)}{2}$$

$$LO_2 = 2A\text{Sin}\left(wt + \theta_1 + \frac{\theta_2 + (2(n-1)\Delta\Phi)}{2}\right)\text{Cos}\frac{(\theta_2 + [2(n-1)-2]\Delta\Phi)}{2}$$

$$LO_3 = 2A\text{Sin}\left(wt + \theta_1 + \frac{\theta_2 + 2(n-1)\Delta\Phi}{2}\right)\text{Cos}\frac{(\theta_2 + [2(n-1)-4]\Delta\Phi)}{2}$$

$$LO_n = 2A\text{Sin}\left(wt + \theta_1 + \frac{\theta_2 + 2(n-1)\Delta\Phi}{2}\right)\text{Cos}\frac{(\theta_2 + 2(n-1)\Delta\Phi)}{2}$$

From the above, the same phase of $$\theta_1 + \frac{\theta_2 + 2(n-1)\Delta\Phi}{2}$$

is present for all the LO reference signals. The amplitude is different and may be adjusted in the reference LO signals without changing the reference phase to provide a set of synchronized reference LO signals with the same reference phase and amplitude.

Figure 1A:
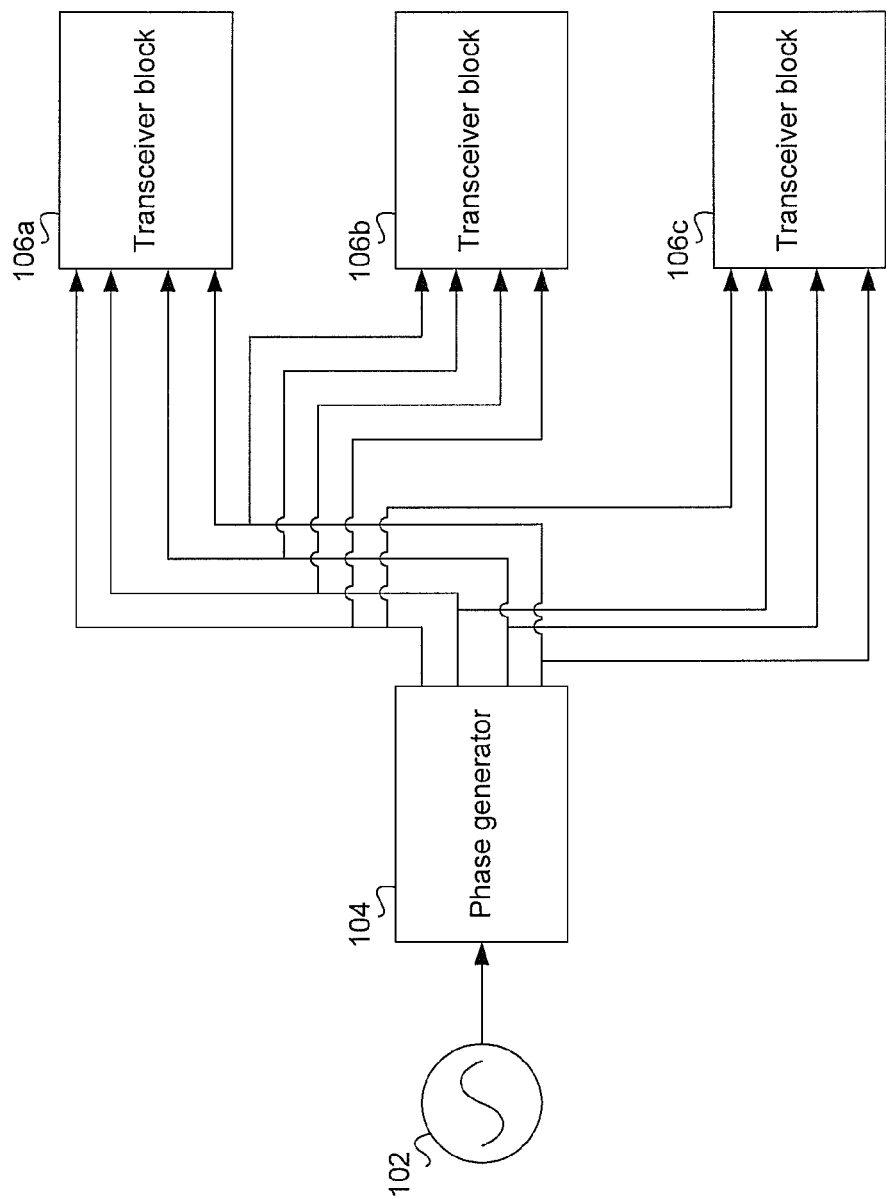
FIG. 1A depicts a first conventional technique for generating a plurality of phases of an LO signal.
Figure 1B:
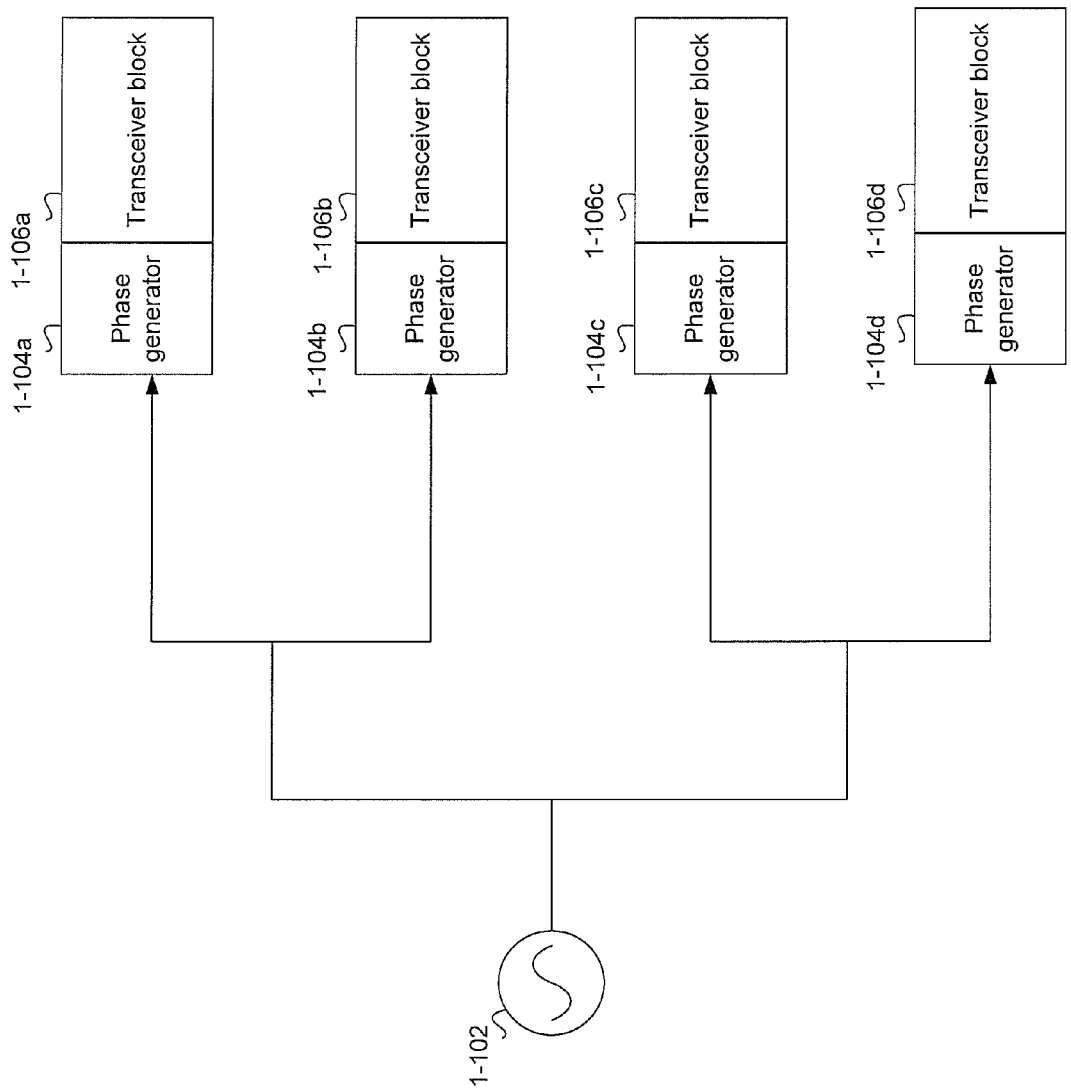
FIG. 1B depicts a second conventional technique for generating a plurality of phases of an LO signal.
Figure 2:
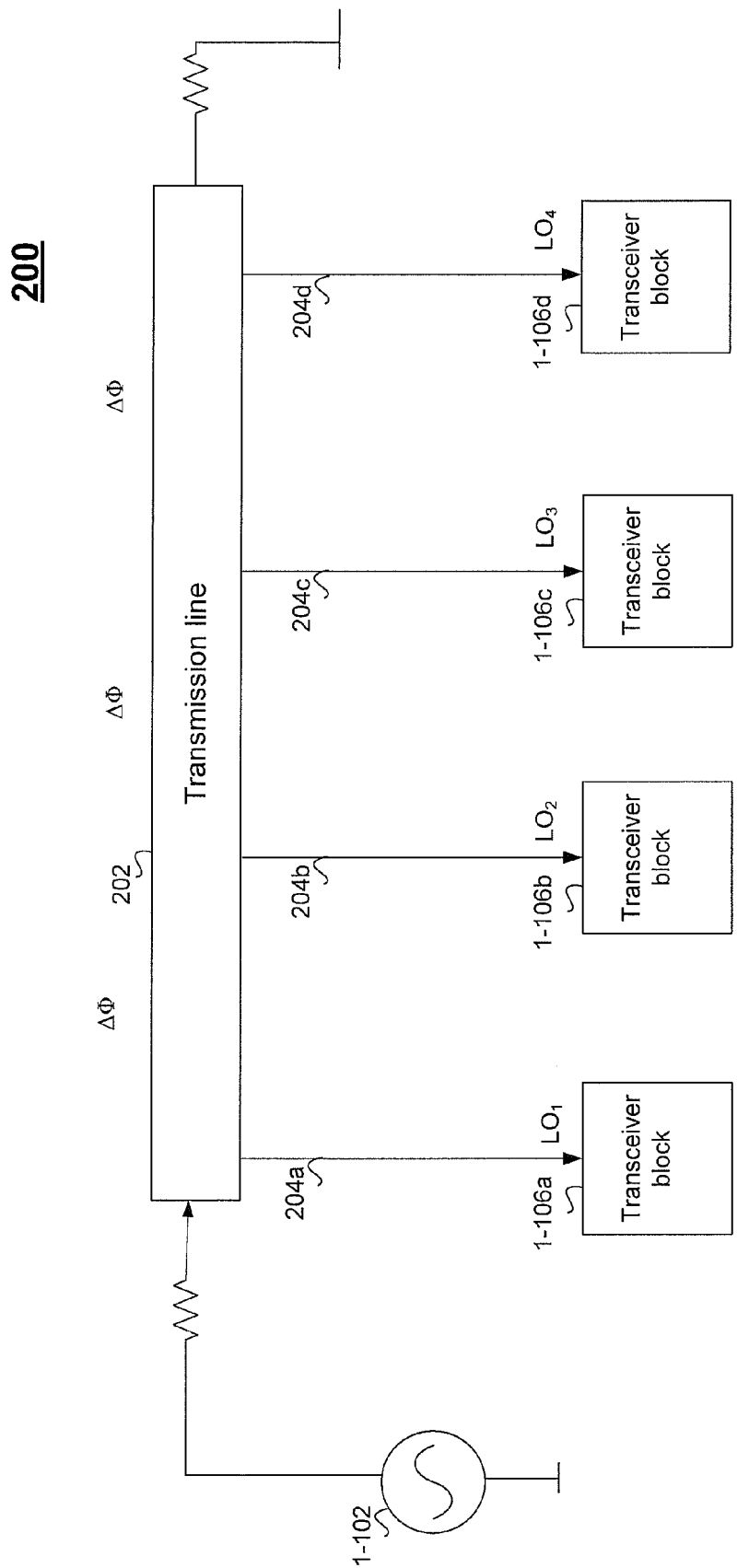
FIG. 2 depicts a conventional system that taps a transmission line.

Accordingly, U-shaped transmission line 402 is used to provide a reference signal with the same reference phase to each transceiver block 3-306. U-shaped transmission line 402 may use less area than the conventional approaches discussed above with respect to FIGS. 1A and 1B and also provides a way of synchronizing the reference LO signal as was needed in the system of FIG. 2.

Figure 5A:
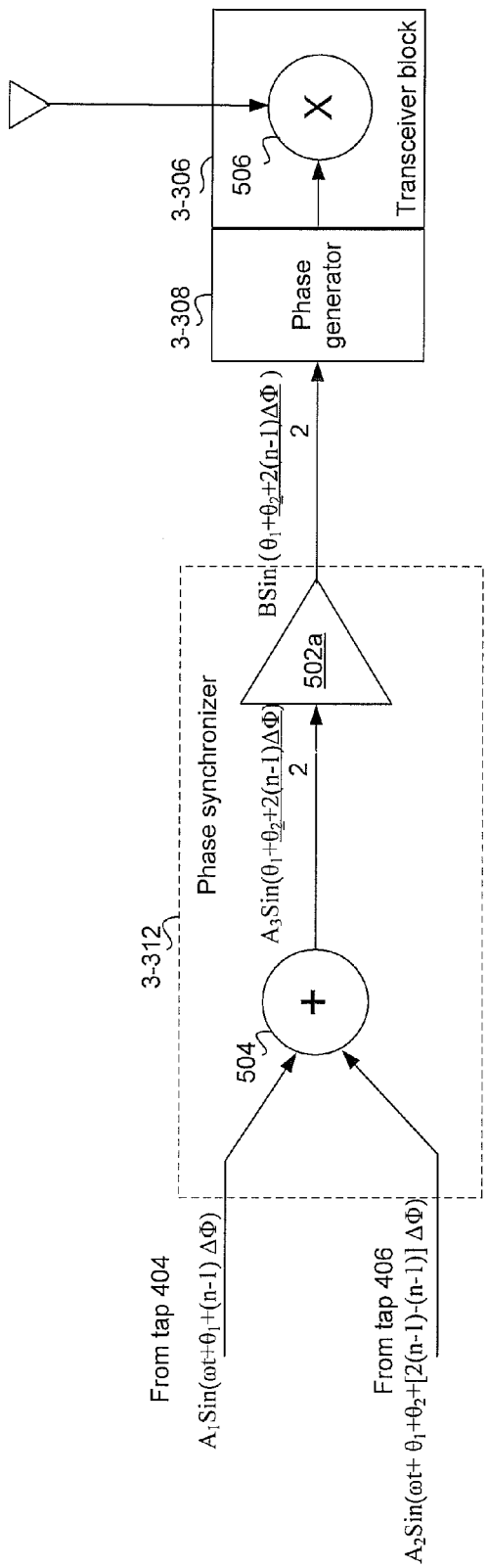
FIG. 5A depicts another example of a phase synchronizer according to one embodiment.

In one embodiment, a limiter is used to adjust the amplitude of the LO signals. The amplitude may be adjusted because if there is an amplitude mismatch between two delayed versions of the LO signal that are to be added, a phase error may be created. FIG. 5A depicts an example of phase synchronizer 3-312 according to one embodiment. The logic shown may be provided for each transceiver block 3-306. It will be understood that the logic may be part of transceiver block 3-306 or outside transceiver block 3-306.

Phase synchronizer 312 includes a limiter 502a, which may be an operational amplifier that is used to adjust the amplitude. For example, limiter 502a may be used to increase or decrease the amplitude of the reference LO signal.

A first input is received from first tap 404 and a second input is received from second tap 4-406. The LO signals with different phases are added using an adder 504. The added signal result in the reference LO signal with the reference phase, but with a different amplitude from other reference LO signals received at other transceiver blocks 3-306. Limiter 502a is then configured to adjust the amplitude of the signal output by adder 504. In this case, the amplitude is changed to from an amplitude $A_3$ to B. In one embodiment, limiter 502a may be part of a conventional system for down converting the radio frequency.

The reference LO signal can then be input into phase generator 3-308. Phase generator 3-308 generates the desired phase for input into a mixer 506. As is apparent to a person skilled in the art based on the disclosure and teachings provided herein, mixer 506 down converts the radio frequency signal received from antenna 304 to the desired operating frequency using the LO signal output by phase generator 3-308.

Figure 5B:
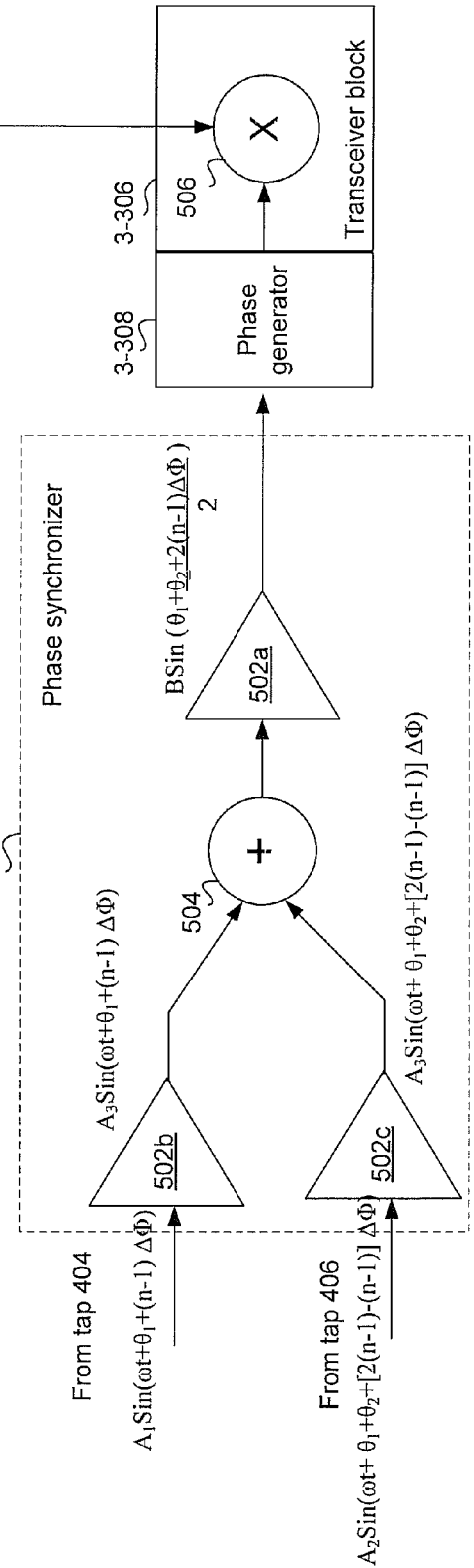
FIG. 5B depicts another example of the phase synchronizer according to one embodiment.

If transmission line 402 is very lossy, then the amplitude of LO signals received from first tap 4-404 and second tap 4-406 may be adjusted before input into adder 514. Having signals added with accurate amplitudes by all transceiver blocks 3-306 may provide a more accurate addition to produce the reference LO signal. In one example, limiters 502 may be placed before adder 504. FIG. 5B shows another example of phase synchronizer 312 according to one embodiment. As shown, limiters 502b and 502c have been placed before adder 504. Limiters 502b and 502c may be stand-alone blocks or may be combined with adder 504. Limiters 502b and 502c may not be used if transmission line 4-402 is not very lossy.

Limiters 502b and 502c may restore the amplitude of inputs from first tap 404 and second tap 4-406. For example, the LO signal received from second tap 4-406 traveled farther on transmission line 4-402 and may have incurred some loss in amplitude. Restoring the amplitude makes both LO signals have the same amplitude.

After passing through limiters 502b and 502c, both amplitudes of the input signals may be equal to $A_3$. The two LO signals are then be added together. Further, after the addition, limiter 502a may also be used to restore the amplitude of the added signal as described above with respect to FIG. 5A.

The first amplitude restoration from limiters 502b and 502c may be performed such that the addition of the two LO signals is performed accurately. Then, the second amplitude restoration using limiter 502a is performed to provide a well-conditioned signal to phase generator 3-308.

Figure 6:
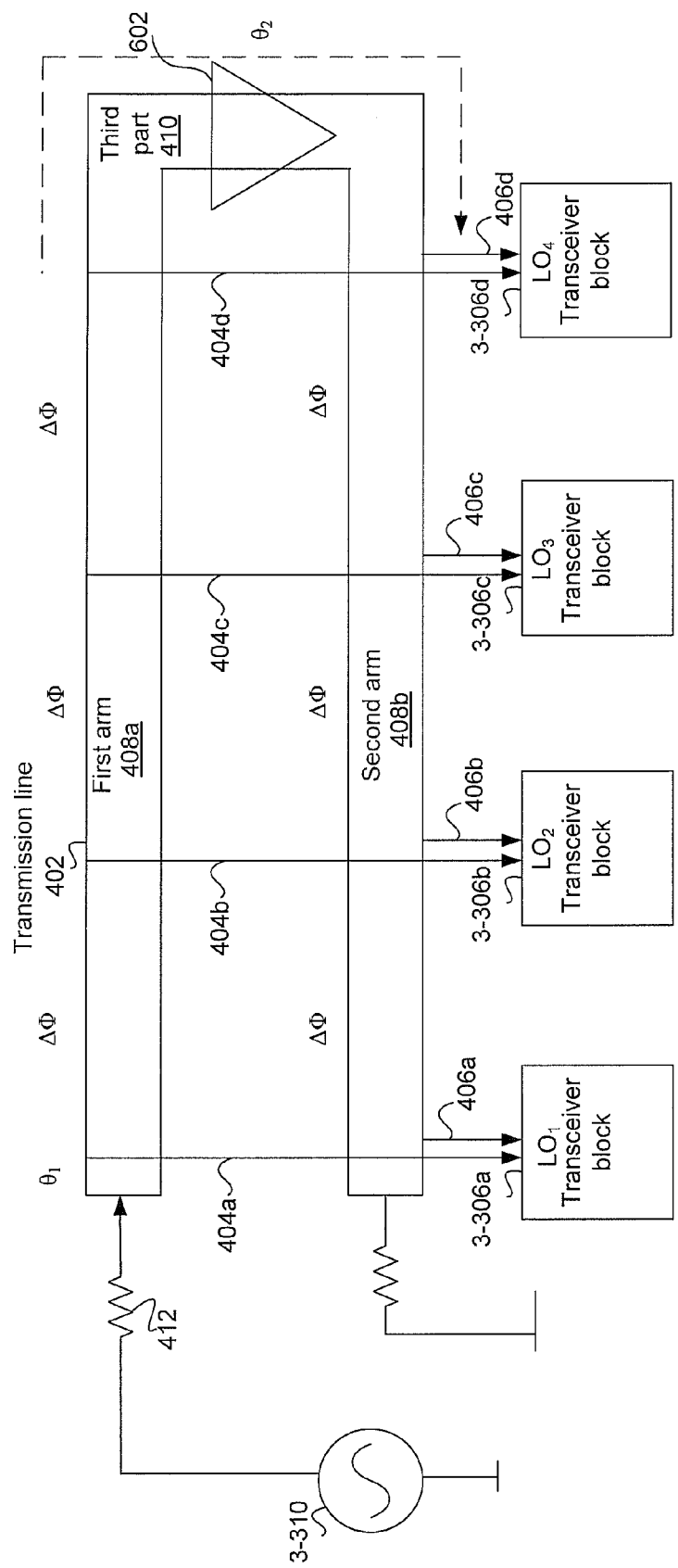
FIG. 6 depicts another example of the phase synchronizer according to one embodiment.

In yet another example, an amplifier may be inserted in transmission line 4-402 if transmission line 4-402 is very lossy. FIG. 6 depicts an example of transmission line 4-402 with an amplifier 602 according to one embodiment. As shown, amplifier 602 has been added to transmission line 4-402 to restore the amplitude of the LO signal. If the loss of transmission line 4-402 is small, then the example shown in FIG. 4 may be used. However, if transmission line 4-402 is very lossy, amplifier 602 may be used to compensate for the loss of the line. Amplifier 602 may be used in lieu of limiters 5-502b and 5-502c, or in combination with.

In one embodiment, amplifier 602 may be inserted at third part 3-310 of the U-shape of transmission line 4-402; however, it will be understood that amplifier 602 may be inserted in other positions. Inserting amplifier 602 at third part 3-310 may affect the phase shift of $\theta_2$. However, changing the phase shift of $\theta_2$ does not adversely affect generating of the reference phase because all the LO signals received from second taps 4-406 have the same phase shift $\theta_2$. A different $\theta_2$ still results in the same reference phase for all transceivers 3-302.

Figure 7:
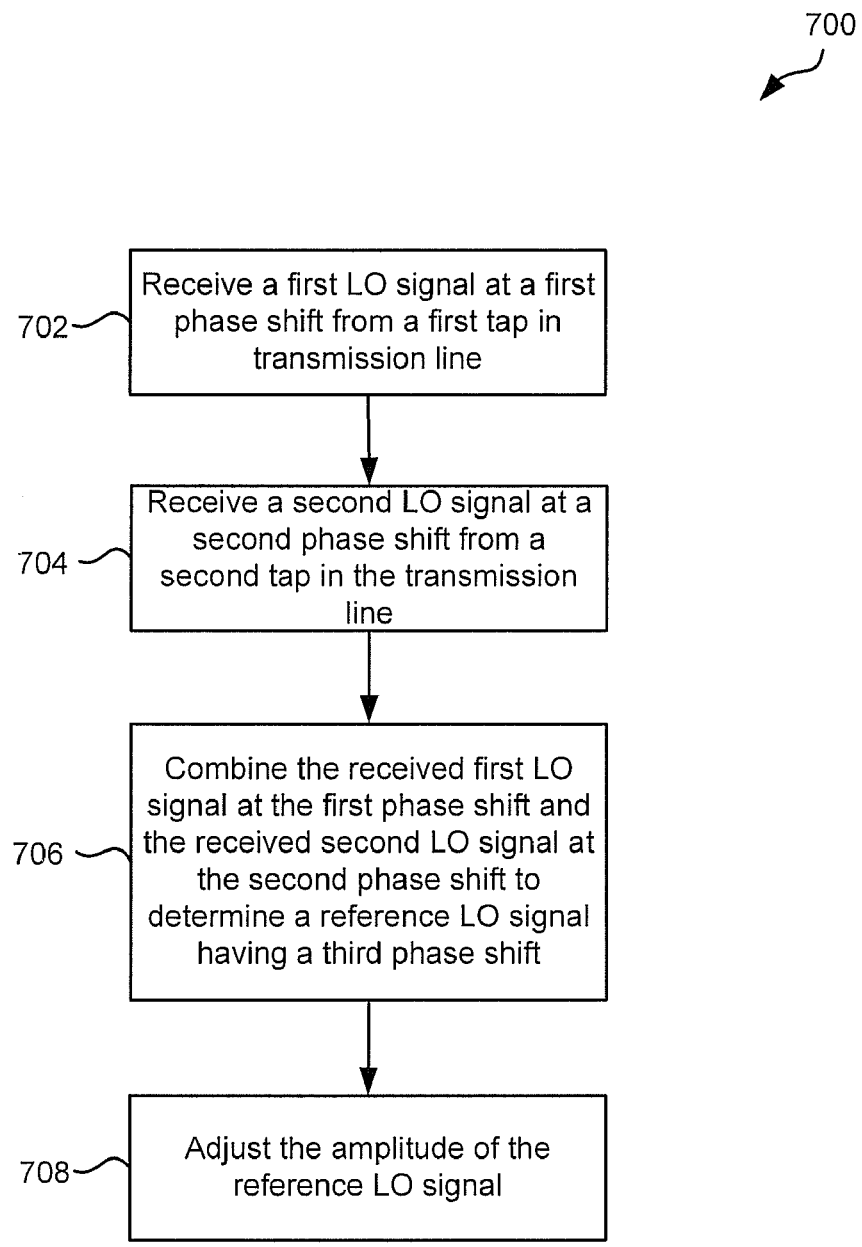
FIG. 7 depicts a simplified flowchart of a method for processing LO signals according to one embodiment.

FIG. 7 depicts a simplified flowchart 700 of a method for processing LO signals according to one embodiment. At 702, phase synchronizer 3-312 receives a first LO signal at a first phase shift from a first tap 404 in transmission line 4-402. At 704, phase synchronizer 3-312 receives a second LO signal at a second phase shift from a second tap in the transmission line.

At 706, phase synchronizer 3-312 combines the received first LO signal at the first phase shift and the received second LO signal at the second phase shift to determine a reference LO signal having a third phase shift. The third phase shift is a same phase shift as a reference LO signal determined by other transceiver blocks 3-306 in the plurality of transceiver blocks 3-306.

At 708, phase synchronizer 3-312 adjusts the amplitude of the reference LO signal. For example, phase synchronizer 3-312 adjusts the amplitude to be the same as other reference LO signals for other transceiver blocks 3-306.

Accordingly, a phase synchronized reference signal is provided to transceiver blocks 3-306. The shape of transmission line 402 and the use of multiple taps efficiently uses area on a chip and provides the phase synchronization accurately.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents will be evident to those skilled in the art and may be employed without departing from the scope of the invention as defined by the claims.

What is claimed is:

1. A transceiver comprising:
a local oscillator (LO) configured to generate an LO signal;
a transmission line configured to receive the LO signal from the local oscillator and transmit the LO signal;
a set of first taps coupled to the transmission line to tap the transmitted LO signal from the transmission line; and
a set of second taps coupled to the transmission line to tap the transmitted LO signal from the transmission line; and
a plurality of transceiver blocks configured to receive and transmit a plurality of phase shifted radio frequency signals, wherein for each transceiver block in the plurality of transceiver blocks, a first LO signal at a first phase shift is received from a first tap in the set of taps and a second LO signal at a second phase shift is received from a second tap in the set of taps,
wherein for each transceiver block in the plurality of transceiver blocks, the received first LO signal at the first phase shift and the received second LO signal at the second phase shift are combined to determine a reference LO signal having a third phase shift, and
wherein each reference LO signal determined for each transceiver block has the third phase shift.

2. The apparatus of claim 1, wherein:
each first tap in the set of first taps is positioned a substantially equal distance from a neighboring first tap on the transmission line; and
each second tap in the set of second taps is positioned a substantially equal distance from a neighboring second tap on the transmission line.

3. The apparatus of claim 1, wherein the transmission line is in a U shape, the U shape including a first arm, a second arm and a third part.

4. The apparatus of claim 3, wherein:
the first tap for each transceiver block is coupled to a relative position from the third part on the first arm; and
the second tap for each transceiver block is coupled to the relative position from the third part on the second arm.

5. The apparatus of claim 1, wherein:
each first tap receives the first LO signal at a different first phase shift from first LO signals received at other first taps; and
each second tap receives the second LO signal at a different first phase shift from second LO signals received at other second taps.

6. The apparatus of claim 1, wherein:
an average of (i) the first phase shift and (ii) the second phase shift for each transceiver block is the reference phase shift; and
the reference LO signals for different transceiver blocks have different amplitudes.

7. The apparatus of claim 1, wherein the plurality of transceiver blocks are equally spaced from each other.

8. The apparatus of claim 1, further comprising an adder configured to combine (i) the received first LO signal at the first phase shift and (ii) the received second LO signal to determine the reference LO signal.

9. The apparatus of claim 8, further comprising a limiter positioned after the adder, wherein the limiter is configured to adjust the amplitude of the reference LO signal being transmitted on the transmission line.

10. The apparatus of claim 8, further comprising a first limiter positioned before the adder and a second limiter positioned before the adder, the first limiter adjusting an amplitude of the first LO signal and the second limiter adjusting the amplitude of the second LO signal.

11. The apparatus of claim 1, further comprising an amplifier positioned on the transmission line, the amplifier configured to restore an amplitude of the LO signal being transmitted on the transmission line.

12. The apparatus of claim 11, wherein the amplifier is positioned on a third part of the transmission line, the third part being in between a first tap and a second tap.

13. The apparatus of claim 1, further comprising a phase generator configured to use the reference LO signal to generate a plurality of phases for a third LO signal for down or up conversion of a phase shifted radio frequency signal in the plurality of phase shifted radio frequency signals.

14. The apparatus of claim 1, wherein a $\theta_1$ phase shift on the transmission line is before reaching a first tap in the first set of taps, N $\Delta\Phi$ phase shifts are in between N first taps in the first set of taps, a $\theta_2$ phase shift between a first tap and a second tap, and N $\Delta\Phi$ phase shifts in between N second taps in the second set of taps, wherein $\theta_1$, $\Delta\Phi$, and $\theta_2$ are phase shift values of the LO signal.

15. The apparatus of claim 14, wherein the first phase shift for the LO signal for each first tap is the $\theta_1$ phase shift and a different number of $\Delta\Phi$ phase shifts in between N first taps depending on where each first tap taps the transmission line.

16. The apparatus of claim 15, wherein the second phase shift for the LO signal for each second tap is the $\theta_1$ phase shift, the $\theta_2$ phase shift, the N $\Delta\Phi$ phase shifts in between N first taps, and a different number of $\Delta\Phi$ phase shifts in between N second taps depending on where each second tap taps the transmission line.

17. A wireless communication system further comprising the apparatus of claim 1.

18. A method comprising:
providing a plurality of transceiver blocks for receiving and transmitting a plurality of phase shifted radio frequency signals;

for each transceiver block, performing:
> receiving a first LO signal at a first phase shift from a first tap in a transmission line;
> receiving a second LO signal at a second phase shift from a second tap in the transmission line; and
> combining the received first LO signal at the first phase shift and the received second LO signal at the second phase shift to determine a reference LO signal having a third phase shift, wherein the third phase shift is a same phase shift as a reference LO signal determined by other transceiver blocks in the plurality of transceiver blocks.

19. The method of claim 18, wherein the transmission line is in a U shape, the U shape including a first arm, a second arm and a third part.

20. The method of claim 18, wherein:
> the average of (i) the first phase shift and (ii) the second phase shift for each transceiver block is the reference phase shift; and
> the reference LO signals for different transceiver blocks have difference amplitudes.

* * * * *